US007724594B2

United States Patent
Xi et al.

(10) Patent No.: US 7,724,594 B2
(45) Date of Patent: May 25, 2010

(54) LEAKAGE CURRENT CONTROL DEVICE OF SEMICONDUCTOR MEMORY DEVICE

(75) Inventors: Sung Soo Xi, Seoul (KR); Chae Kyu Jang, Gyeonggi-do (KR); Hoe Kwon Jeong, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/044,484

(22) Filed: Mar. 7, 2008

(65) Prior Publication Data

US 2008/0151662 A1    Jun. 26, 2008

Related U.S. Application Data

(62) Division of application No. 11/148,567, filed on Jun. 9, 2005, now abandoned.

(30) Foreign Application Priority Data

Oct. 22, 2004   (KR)   ............... 10-2004-0084639

(51) Int. Cl.
  *G11C 7/20* (2006.01)
  *G11C 7/12* (2006.01)
(52) U.S. Cl. ............... 365/203; 365/227
(58) Field of Classification Search ............... 365/203, 365/222, 230.03, 277, 189.011, 230.04, 230.06
  See application file for complete search history.

(56) References Cited

U.S. PATENT DOCUMENTS

| 5,594,701 | A | 1/1997 | Asaka et al. |
| 5,909,388 | A | 6/1999 | Mueller |
| 6,055,615 | A | 4/2000 | Okajima |
| 6,111,802 | A | 8/2000 | Kano et al. |
| 6,434,065 | B1 | 8/2002 | Kobayashi et al. |
| 6,493,281 | B2 * | 12/2002 | Mizugaki ............... 365/222 |
| 2004/0062110 | A1 | 4/2004 | Shirley |
| 2004/0223396 | A1 | 11/2004 | Nakamura et al. |
| 2005/0018520 | A1 | 1/2005 | Marshall |

FOREIGN PATENT DOCUMENTS

| JP | 4-183000 A | 6/1992 |
| JP | 05-128858 | * 5/1993 |
| JP | 06-044800 | 2/1994 |
| JP | 07-272483 | 10/1995 |
| JP | 10-335583 | 12/1998 |
| JP | 2003-188351 | 7/2003 |

OTHER PUBLICATIONS

Machine translation of Japanese patent publication 05-128858.*

* cited by examiner

*Primary Examiner*—VanThu Nguyen
*Assistant Examiner*—Douglas King
(74) *Attorney, Agent, or Firm*—Townsend and Townsend and Crew LLP

(57) ABSTRACT

A leakage current control device of a semiconductor memory device is provided to effectively remove leakage current flowing from a bit line to a word line when a process defect is generated by gate residues of the semiconductor memory device, thereby reducing unnecessary current consumption. In the leakage current control device, the bit line boosted to a voltage level of core voltage/2 is controlled at a ground voltage level during a precharge period to remove unnecessary leakage current flowing from the bit line to a word line bridge.

6 Claims, 8 Drawing Sheets

LEAKAGE CURRENT CONTROL DEVICE OF SEMICONDUCTOR MEMORY DEVICE

BACKGROUND OF THE INVENTION

1. Field of the Invention

The present invention generally relates to a leakage current control device of a semiconductor memory device, and more specifically, to a technology of effectively removing leakage current when a process defect is generated by gate residues.

2. Description of the Related Art

Generally, in most of DRAM planner processes using semiconductors a process defect caused by gate residues results in a bridge phenomenon which shorts neighboring metals.

Due to the bridge phenomenon between metals, an unnecessary current path is formed to increase power consumption of a memory, which degrades the performance of the product.

FIGS. 1 and 2 are diagrams illustrating a path of leakage current by the gate residue process defect in a conventional semiconductor memory device.

In the conventional semiconductor memory device, a word line WL and a bit line BL are connected to a resistor R and a capacitor C. While the semiconductor memory device is precharged, the word line WL transits to a ground voltage level, and the bit line BL is maintained at a core voltage/2 (bit line precharge voltage VBLP).

However, when the above-described state is maintained for a long time, a current path is formed from the bit line BL to the word line WL, so that unnecessary current is consumed. Moreover, it is difficult to solve the process defect by complementation on the process as a critical dimension of the semiconductor memory becomes more microscopic.

Specifically, a basic refresh operation is required to maintain data for the minimum power consumption at a standby mode of a low power consumption memory product. However, when leakage current is generated by a gate residue phenomenon at the standby mode of the low power consumption memory product, unnecessary current is consumed.

SUMMARY OF THE INVENTION

Various embodiments of the present invention are directed at controlling a pair of bit lines, which are boosted to a voltage level of core voltage/2 during a precharge or standby period, at a ground voltage level to remove unnecessary leakage current flowing into a word line.

According to one embodiment of the present invention, a leakage current control device of a semiconductor memory device comprises a control signal generating unit adapted and configured to control a driving control signal in response to a block selecting signal, and a plurality of current blocking driving element adapted and configured to be turned on in response to the driving control signal during a precharge period and to transit a voltage level of a bit line to a ground voltage to intercept a current path formed from the bit line to a word line.

According to another embodiment of the present invention, a leakage current control device of a semiconductor memory device comprises a refresh block detecting unit adapted and configured to detect a block where a refresh operation is performed in response to a driving control signal generated by combination of a block selecting signal, a control signal input unit adapted and configured to latch an output signal from the refresh block detecting unit for a predetermined time at a standby mode, and a voltage control unit adapted and configured to supply a bit line precharge voltage to a bit line in response to an output signal from the control signal input unit at a refresh mode and to supply a ground voltage to the bit line at the standby mode.

According to still another embodiment of the present invention, a leakage current control device of a semiconductor memory device comprises a block detecting unit adapted and configured to sense a block selecting signal and to control activation of a selected cell array block, a logic unit adapted and configured to combine a predetermined logic signal and an output signal from the block detecting unit and to output a control signal for activating a corresponding cell array block, and a voltage control unit adapted and configured to supply a bit line precharge voltage to a bit line of the cell array block in response to an output signal from the logic unit at a refresh mode, and to supply a ground voltage to the bit line at the standby mode.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
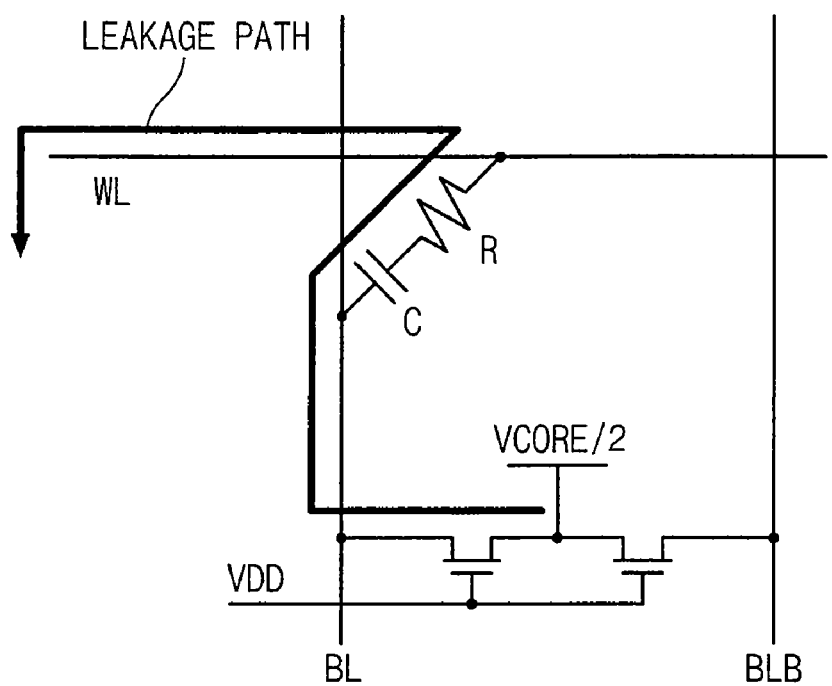
FIGS. 1 and 2 are diagrams illustrating a path of leakage current in a conventional semiconductor memory device.
Figure 2:
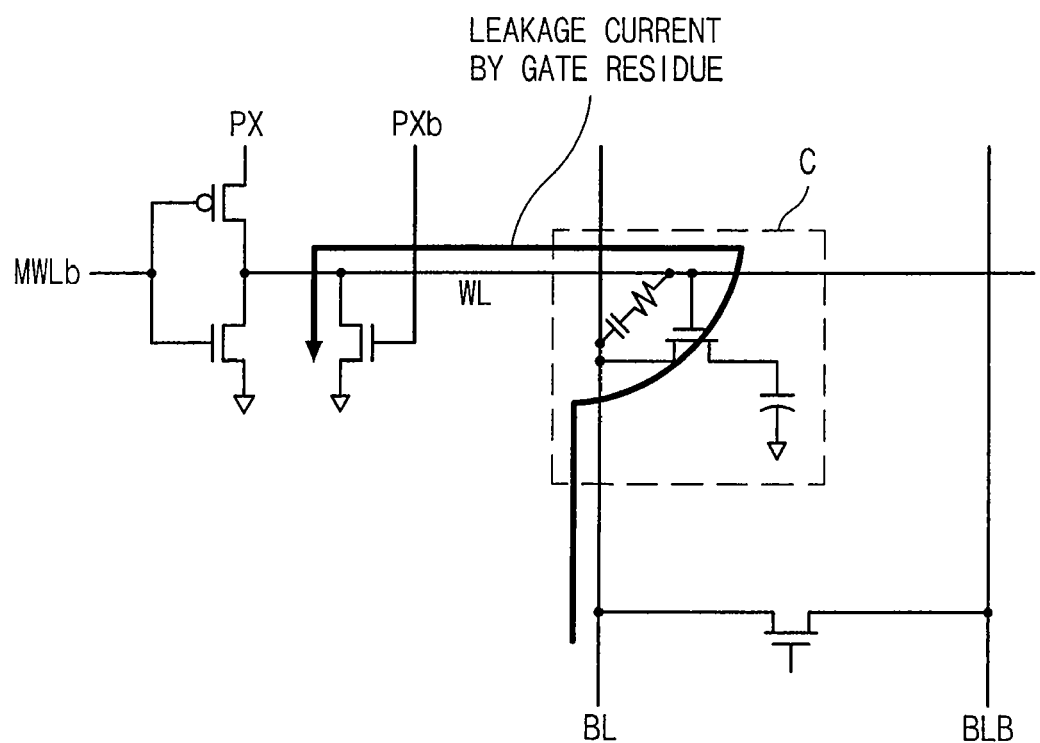
Figure 3:
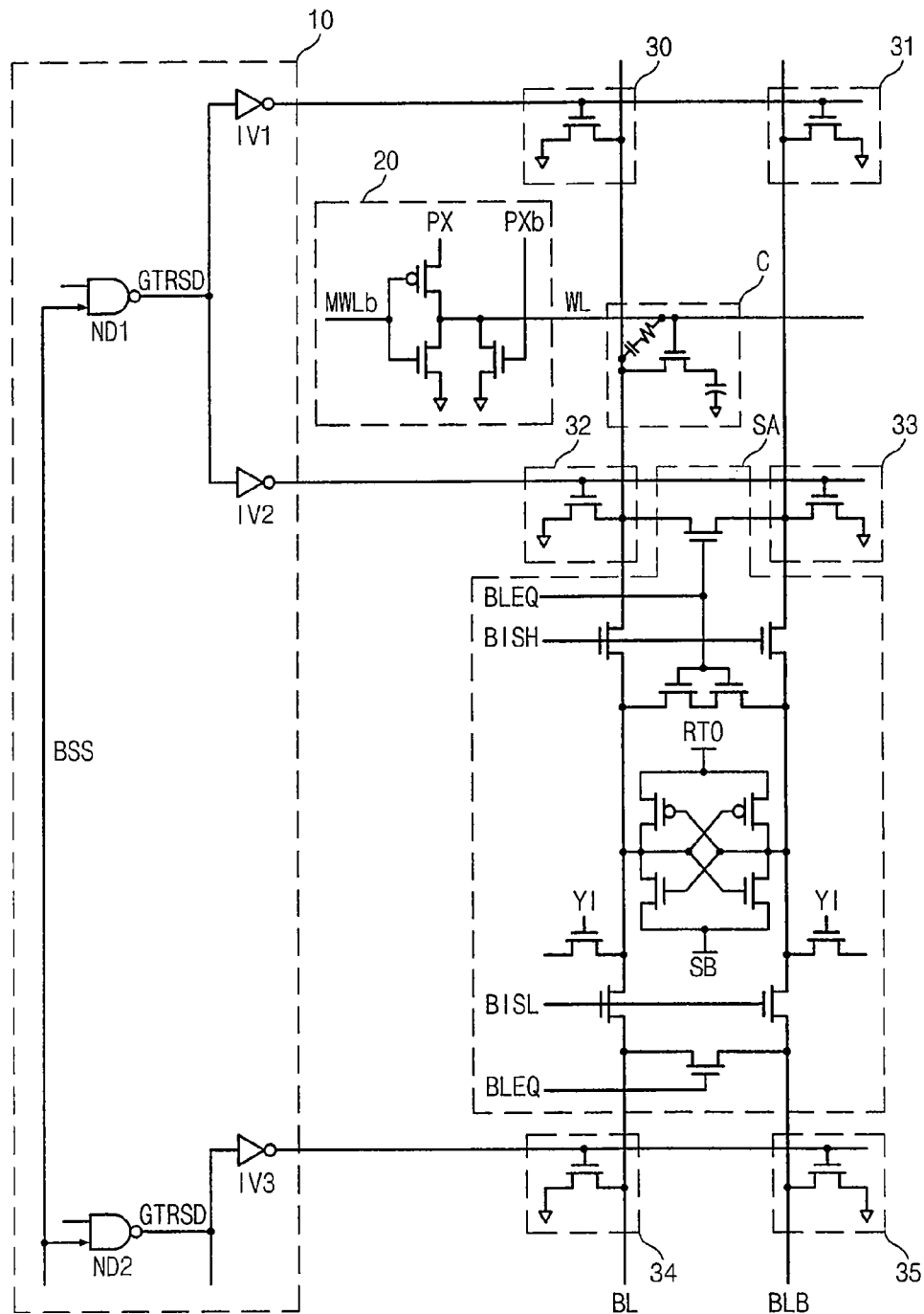
FIG. 3 is a circuit diagram illustrating a leakage current control device of a semiconductor memory device according to an embodiment of the present invention.

FIG. 3 is a circuit diagram illustrating a leakage current control device of a semiconductor memory device according to an embodiment of the present invention.

In this embodiment, a leakage current control device comprises a control signal generating unit 10, a sub word line driving unit 20, a sense amplifier SA and a plurality of current blocking driving elements 30~35.

To more fully illustrate this configuration, the control signal generating unit 10 comprises NAND gates ND1, ND2, and inverters IV1~IV3.

The NAND gate ND1 performs a NAND operation on a logic high signal and a block selecting signal BSS to output a driving control signal GTRSD. The inverters IV1, IV2 invert the driving control signal GTRSD. The NAND gate ND2 performs a NAND operation on the logic high signal and the block selecting signal BSS to output the driving control signal GTRSD. The inverter IV3 inverts the driving control signal GTRSD.

Each of the plurality of current blocking driving elements 30~35, which are connected between paired bit lines BL and BLB and a ground voltage terminal, comprises a plurality of NMOS transistors that have each gate to receive output signals from the inverters IV1~IV3.

Figure 4:
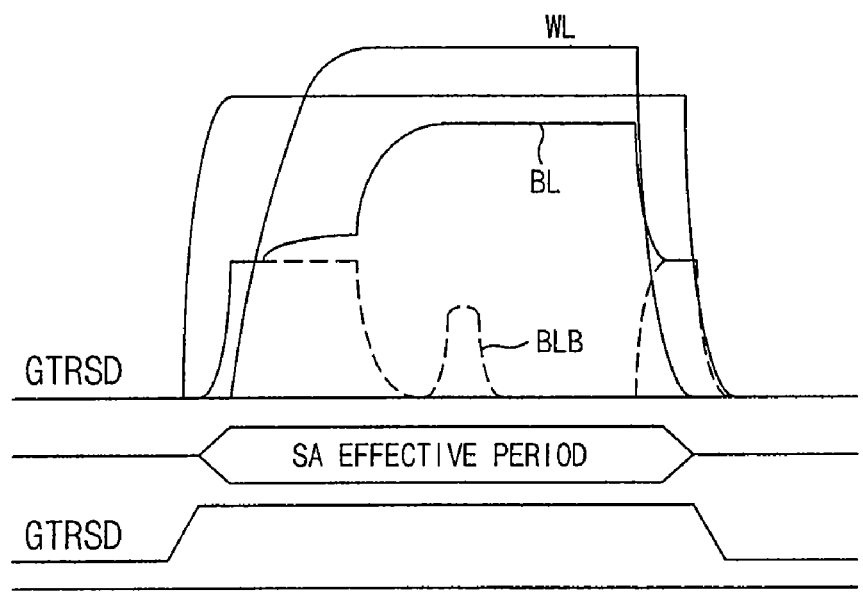
FIG. 4 is a waveform diagram of each control signal of the leakage current control device of the semiconductor memory device according to an embodiment of the present invention.
Figure 5:
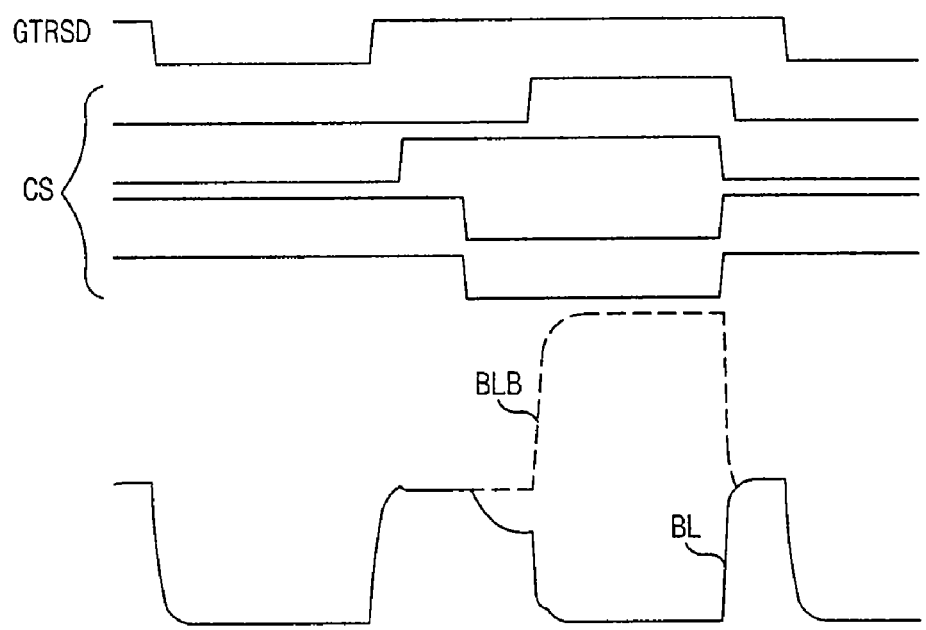
FIG. 5 is a simulation diagram illustrating the leakage current control device of the semiconductor memory device according to an embodiment of the present invention.

The operation process of the leakage current control device according to the embodiment of the present invention is described with reference to simulation diagrams of FIGS. 4 and 5.

The paired bit lines BL and BLB are precharged to a bit line precharge voltage (core voltage VCORE/2) level before a word line WL is activated.

When the corresponding word line WL is activated, the block selecting signal BSS becomes 'low' which is relatively faster that the decoded word line WL. As a result, the driving control signal GTRSD outputted from the NAND gates ND1 and ND2 becomes 'high' during an effective period of the sense amplifier SA.

Then, the output signals from the inverters IV1~IV3 become 'low', so that all of the current blocking driving elements 30~35 are kept off. Thus, the paired bit lines BL and BLB are precharged to a bit line precharge voltage VBLP (core voltage/2) during an active period to perform a general memory operation.

That is, the sense amplifier SA positioned above and below one corresponding word line WL selected by the block selecting signal BSS is driven by a conventional signal CS.

On the other hand, when an active operation of the corresponding word line WL is completed, the block selecting signal BSS becomes 'high'. The driving control signal GTRSD outputted from the NAND gates ND1 and ND2 transits to 'low'.

Therefore, the output signals from the inverters IV1~IV3 become 'high' to turn on all of the current blocking driving elements 30~35. As a result, the paired bit lines BL and BLB of a cell array where a gate residue phenomenon occurs becomes at a ground voltage level to intercept a leakage path of unnecessary current.

Thus, the leakage current control device according to the embodiment of the present invention supplies the bit line precharge voltage VBLP (core voltage/2) to the bit line BL connected to a Core during the active period, and supplies a ground voltage to the bit line BL during the precharge period. As a result, the path of leakage current flowing in the sub word line driving unit 20 located at a sub hole from a cell C through the word line WL is intercepted.

Figure 6:
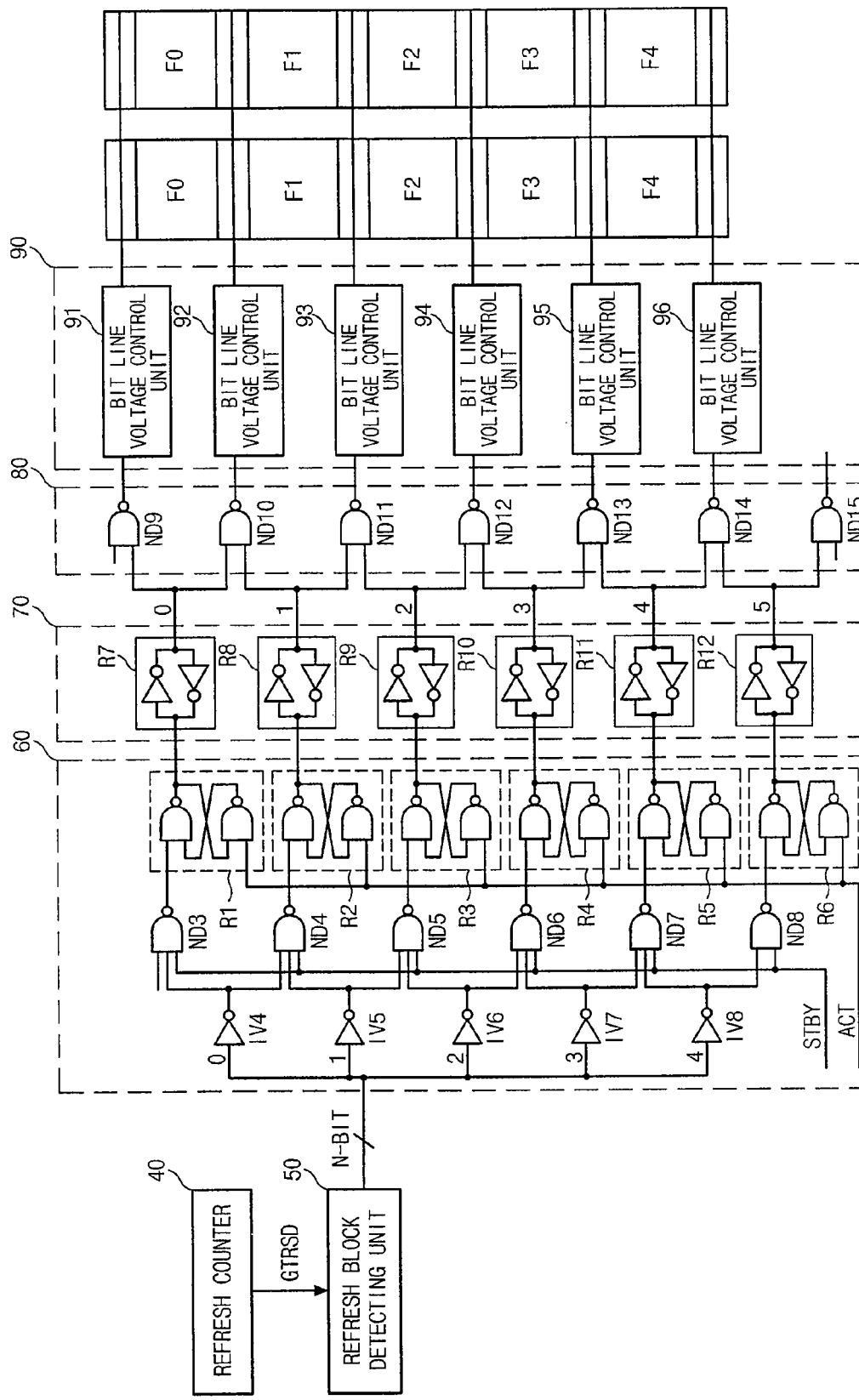
FIG. 6 is a diagram illustrating a leakage current control device of a semiconductor memory device according to another embodiment of the present invention.

Meanwhile, FIG. 6 is a diagram illustrating a leakage current control device of a semiconductor memory device according to another embodiment of the present invention.

In this embodiment, a leakage current control device of FIG. 6 comprises a refresh counter 40, refresh block detecting unit 50, a control signal input unit 60, a latch unit 70, a logic unit 80 and a voltage control unit 90.

The refresh counter 40 performs a refresh counting operation to output the driving control signal GTRSD obtained by combining word line, block selecting and bank selecting signals to the refresh block detecting unit 50. Since the driving control signal GTRSD is relatively faster than a timing when signals for generating the word line WL are decoded, the voltage control unit 90 is controlled by the driving control signal GTRSD. The refresh block detecting unit 50 detects a block where a refresh operation is performed in response to the driving control signal GTRSD to output a control signal of n bits.

The control signal input unit 60 comprises a plurality of inverters IV4, IV5, a plurality of NAND gates ND3~ND8, and a plurality of latches R1~R6.

Here, the plurality of inverters IV4~IV5 invert the control signal of n bits applied from the refresh block detecting unit 50. The plurality of NAND gates ND3~ND8 perform a NAND operation on output signals from the inverters IV4, IV5 and a standby signal STBY. The plurality of latches R1~R6 latch output signals from the plurality of NAND gates ND3~ND8 in response to an active signal ACT.

The control signal input unit 60 is turned off when the active signal ACT and the standby signal STBY are "0". The control signal input unit 60 is activated when the active signal ACT is "0" and the standby signal STBY is "1". Also, the control signal input unit 60 is turned off when the active signal ACT is "1" and the standby signal STBY is "Don't Care".

The latch unit 70 that comprises a plurality of latches R7~R12 latches an output signal from the control signal input unit 60. The logic unit 80 performs a NAND operation on an output signal from the latch unit 70 and a logic high signal.

The voltage control unit 90 that comprises a plurality of bit line voltage control units 91~96 controls the bit line precharge voltage VBLP in response to an output signal from the logic unit 80 to selectively output the voltage VBLP to cell arrays F0~F4.

Figure 7:
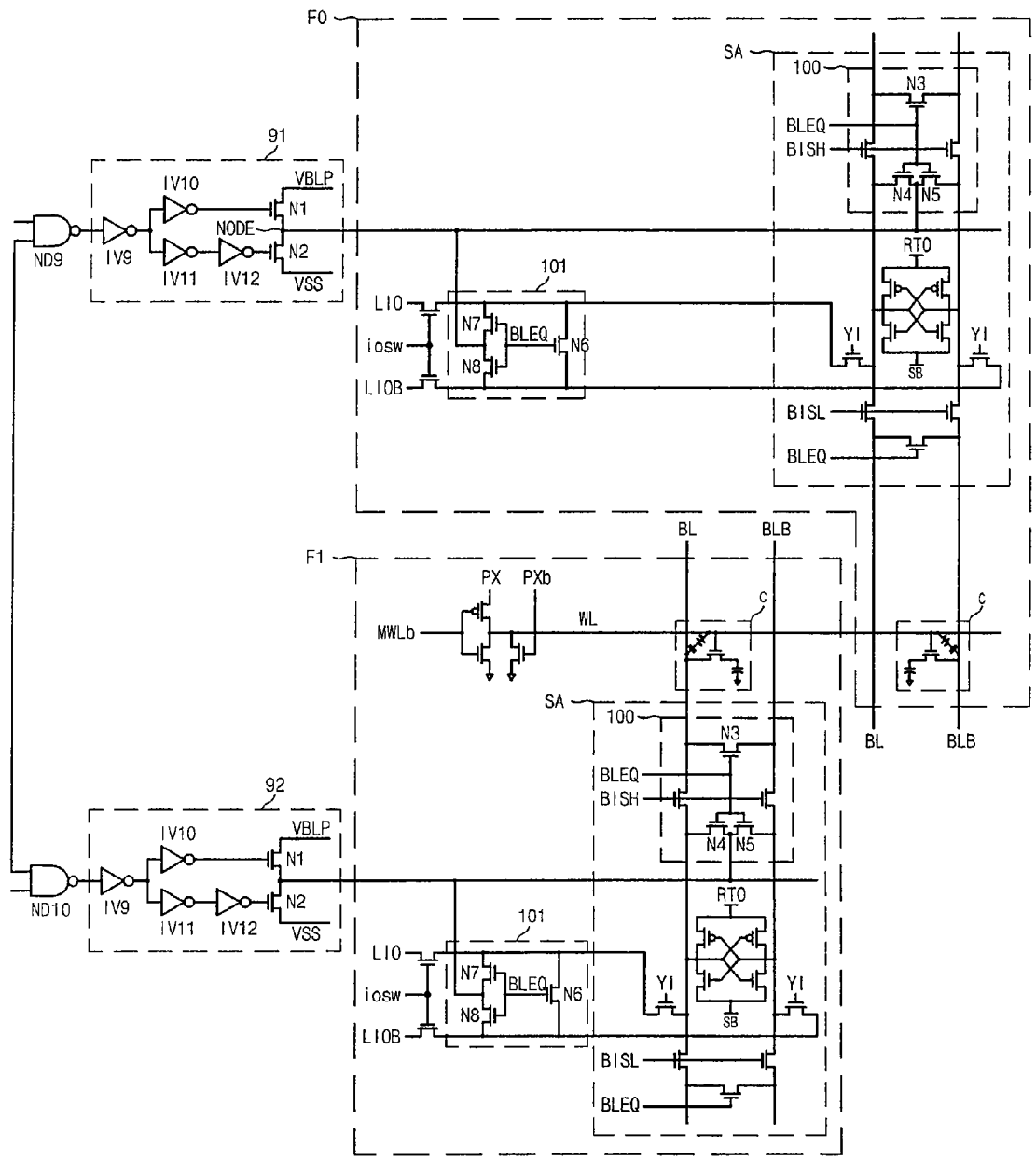
FIG. 7 is a circuit diagram illustrating a bit line voltage control unit of FIG. 6.

FIG. 7 is a circuit diagram illustrating one of the bit line voltage control units 91~96 of FIG. 6. In this embodiment, the bit line voltage control unit 91 is exemplified because the plurality of bit line voltage control units 91~96 have the same configuration.

The bit line voltage control unit 91 comprises inverters IV9~IV12, and NMOS transistors N1, N2.

The inverter IV9 inverts an output signal from the NAND gate ND9, and the inverter IV10 inverts an output signal from the inverter IV9. The inverters IV11 and IV12 non-invert and delay an output signal from the inverter IV9.

The NMOS transistor N1, which is connected between a bit line precharge voltage VBLP terminal and an output node NODE, has a gate to receive an output signal from the inverter IV10. The NMOS transistor N2, which is connected between a ground voltage VSS terminal and the output node NODE, has a gate to receive an output signal from the inverter IV12.

The output node NODE of the bit line voltage control unit 91 which is connected to the bit line precharge unit 100 of the sense amplifier SA controls the paired bit lines BL and BLB at the ground voltage VSS level during the precharge period at the standby mode. The output node NODE of the bit lien voltage control unit 91 which is connected to a precharge unit 101, the paired bit lines BL and BLB at the ground voltage VSS level during the precharge period at the standby mode.

Hereinafter, the operation of the leakage current control device according to the embodiment of the present invention is described.

The refresh counter 40 counts a refresh operation at a refresh mode, and combines a block selecting signal to output the driving control signal GTRSD at a high level during the effective period of the sense amplifier SA.

The refresh counter 40 sequentially accesses a corresponding block using an address generated at the refresh mode, and previously sets a block to be boosted to the bit line precharge voltage VBLP. Here, when a refresh block counted by the refresh counter 40 is the Nth, the bit line precharge voltage (core voltage VCORE/2) is previously supplied to the (N+1)th block.

In other words, when the corresponding word line WL is activated, the active signal ACT becomes "1", and the standby signal STBY becomes "Don't Care", so that the control signal input unit 60 is turned off. As a result, when the mode of the memory is changed into a normal operation mode, the supply of the bit line precharge voltage VBLP is stopped, and a general memory operation is performed.

On the other hand, before the word line WL is activated, the driving control signal GTRSD transits to 'low' during the precharge period. When the active operation of the corresponding word line WL is completed, the active signal ACT becomes "0", and the standby signal STBY controls the operation of the control signal input unit 60. That is, the control signal input unit 60 is turned off when the standby signal STBY is "0", and activated when the standby signal STBY is "1".

When the standby signal STBY becomes "1" at the standby mode, the latch unit 70 outputs a high signal to the logic unit 80, and the logic unit 80 outputs a low signal to the voltage control unit 90.

Next, the NMOS transistor N2 is turned on by output signals from the inverters IV9, IV11 and IV12 in the bit line voltage control unit 91. Then, the ground voltage VSS is supplied to a common connection node of the NMOS transistors N4 and N5 of the bit line precharge unit 100. Also, the ground voltage VSS is supplied to a common connection node of the NMOS transistors N7 and N8 of the precharge unit 100.

Thereafter, when a bit line equalizing signal BLEQ becomes 'high', the NMOS transistors N3~N8 are turned on, so that the paired bit lines BL and BLB become at the ground voltage level. As a result, the paired bit lines BL and BLB of a cell array where the gate residue phenomenon occurs become at the ground voltage level to intercept a leakage path of unnecessary current.

Meanwhile, when the standby signal STBY is "0" while the active signal ACT is "0", the control signal operation unit 60 is turned off. Thus, the latch unit 70 outputs a low signal to the logic unit 80, which outputs a high signal to the voltage control unit 90.

Next, in the bit line voltage control unit 91, the NMOS transistor N1 is turned on by output signals from the inverters IV9 and IV10. As a result, the bit line precharge voltage (core voltage VCORE/2) is supplied to the common connection node of the NMOS transistors N4 and N5 of the bit line precharge unit 100. Then, the bit line precharge voltage (core voltage VCORE/2) is supplied to the common connection node of the NMOS transistors N7 and N8 of the precharge unit 100.

When the bit line equalizing signal BLEQ becomes 'high', the NMOS transistors N3~N8 are turned on, so that the paired bit lines BL and BLB are precharged to a precharge voltage (core voltage VCORE/2) level.

In this embodiment, the bit line precharge voltage VBLP (core voltage/2) is supplied to the bit line BL connected to a bit line Core only in a block where a refresh operation is performed at a standby mode and in a block where the next refresh operation is performed. Then, the ground voltage is supplied to the bit line BL of the rest blocks during the precharge period.

As a result, the rest blocks where the refresh operation is not performed are not affected by the bit line precharge voltage VBLP.

Figure 8:
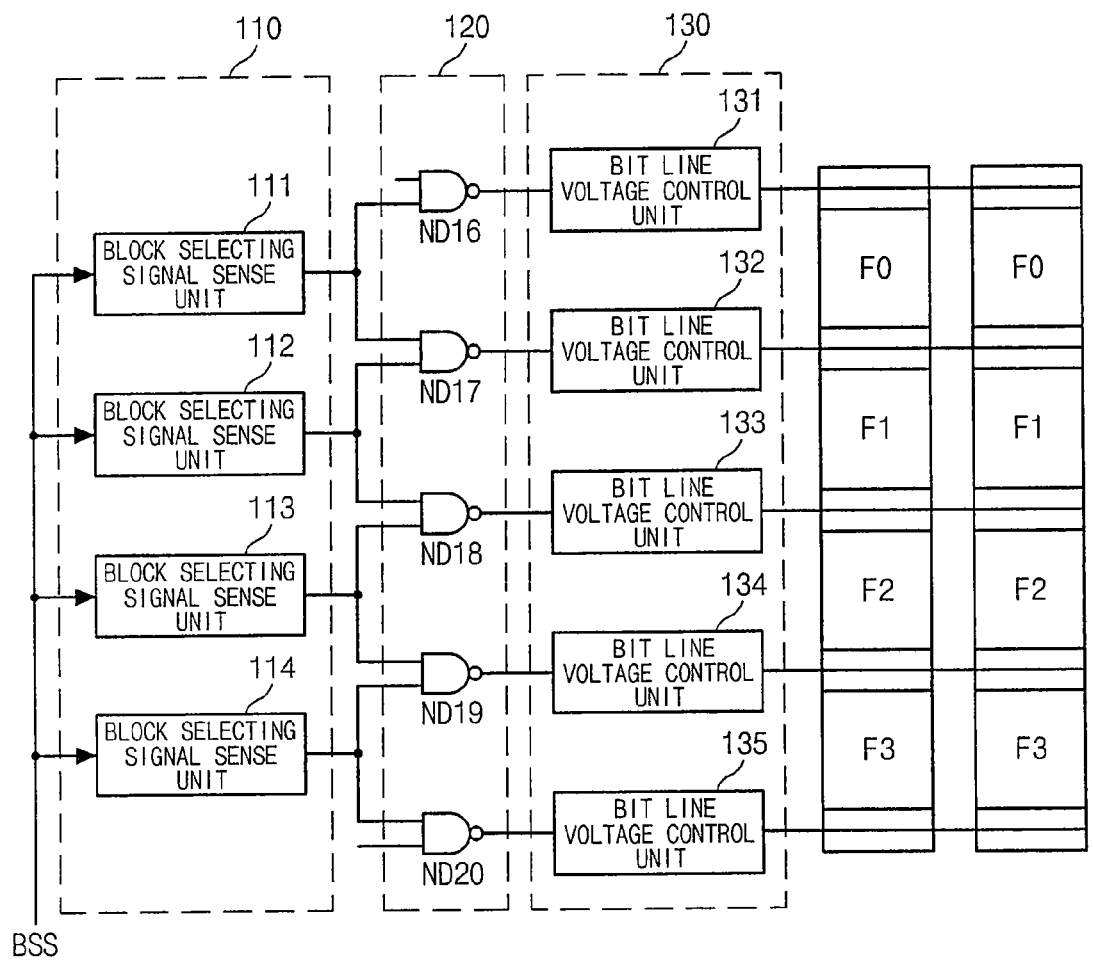
FIG. 8 is a diagram illustrating a leakage current control device of a semiconductor memory device according to still another embodiment of the present invention.

FIG. 8 is a diagram illustrating a leakage current control device of a semiconductor memory device according to still another embodiment of the present invention.

In this embodiment, a leakage current control device of FIG. 8 comprises a block detecting unit 110, a logic unit 120 and a voltage control unit 130.

The block detecting unit 110 which comprises a plurality of block selecting signal sense units 111~114 controls activation of a selected block by a block selecting signal BSS. The logic unit 120 which comprises a plurality of NAND gates ND16~ND20 performs a logic operation on an output signal from the block detecting unit 110. The voltage control unit 130 which comprises a plurality of bit line voltage control units 131 is substantially similar to components described in reference to FIG. 7.

In the embodiment of FIG. 8, when a corresponding word line WL is activated, the block selecting signal BSS which is relatively faster than a decoded word line WL controls the operation of the bit lien voltage control unit 130.

As a result, the paired bit lines BL and BLB are precharged to the bit line precharge voltage VBLP (core voltage/2) level during an active period to perform a general memory operation.

That is, a sense amplifier SA positioned above and below one corresponding word line WL selected by the block selecting signal BSS is driven by a conventional signal CS.

On the other hand, when an active operation of the corresponding word line WL is finished, the block selecting signal BSS becomes 'high' to supply a ground voltage to a bit line BL. Then, paired bit lines BL and BLB of a cell array where a gate residue phenomenon occurs become at a ground voltage level to intercept a leakage path of unnecessary current.

As described above, a leakage current control device according to an embodiment of the present invention is applied to all products using a semiconductor to improve degradation of performance of a memory by a gate residue phenomenon without structural change of a memory core and to reduce unnecessary current and power consumption at a standby mode, thereby improving the performance of the memory.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A leakage current control device of a semiconductor memory device, comprising:
    a refresh block detecting unit configured to detect a block where a refresh operation is performed in response to a driving control signal generated by combination of a block selecting signal;
    a control signal input unit configured to latch and output a signal from the refresh block detecting unit for a predetermined time at a standby mode;
    a voltage control unit configured to supply a bit line precharge voltage to a bit line in response to an output signal from the control signal input unit at a refresh mode and to supply a ground voltage to the bit line at the standby mode, wherein the bit line precharge voltage is supplied to the bit line in the block where the refresh operation is performed and in a block where a subsequent refresh operation is performed;
    a refresh counter configured to count a refresh operation and output the driving control signal in a predetermined refresh period;
    a latch unit configured to latch an output signal from the control signal input unit and output N control signals, wherein N is an integer greater than zero; and a logic unit configured to perform a logic operation on the N control signals and a predetermined logic signal and to output (N+1) control signals to the voltage control unit.

2. The leakage current control device according to claim 1, wherein the block where the refresh operation is performed and the block where the subsequent refresh operation is performed are activated in response to the (N+1) control signals.

3. The leakage current control device according to claim 1, wherein the logic unit comprises a plurality of NAND gates each configured to perform a NAND operation on the predetermined logic signal and an output signal from the latch unit.

4. The leakage current control device according to claim 1, wherein the voltage control unit comprises a plurality of bit line voltage control units,
   wherein each of the plurality of bit line voltage control units comprises:
   a second inverter unit configured to non-invert and delay an output signal from the logic unit;
   a third inverter unit configured to non-invert and delay an output signal from the logic unit;
   a first driving element configured to supply a bit line precharge voltage to the bit line in response to an output signal from the second inverter unit; and
   a second driving element configured to supply a ground voltage to the bit line in response to an output signal from the third inverter unit.

5. The leakage current control device according to claim 4, further comprising a bit line precharge unit configured to be connected to a common connection node of the first driving element and the second driving element and to selectively supply the precharge voltage and the ground voltage to the bit line when a bit line equalizing signal is activated.

6. A leakage current control device of a semiconductor memory device, comprising:
   a refresh block detecting unit configured to detect a block where a refresh operation is performed in response to a driving control signal generated by combination of a block selecting signal;
   a control signal input unit configured to latch and output a signal from the refresh block detecting unit for a predetermined time at a standby mode;
   a voltage control unit configured to supply a bit line precharge voltage to a bit line in response to an output signal from the control signal input unit at a refresh mode and to supply a ground voltage to the bit line at the standby mode, wherein the bit line precharge voltage is supplied to the bit line in the block where the refresh operation is performed and in a block where a subsequent refresh operation is performed;
   a first inverter unit configured to invert an output signal of N bits applied from the refresh block detecting unit, wherein N is an integer greater than zero;
   a logic unit a configured to perform a logic operation on a predetermined level signal, an output signal from the first inverter unit, and a standby signal activated at the standby mode; and
   a first latch unit configured to latch an output signal from the logic unit for a predetermined time when an active signal is activated.

* * * * *